(12) United States Patent
Song et al.

(10) Patent No.: US 8,119,258 B2
(45) Date of Patent: Feb. 21, 2012

(54) WHITE ORGANIC LIGHT EMITTING DEVICE (OLED)

(75) Inventors: Jung-Bae Song, Yongin-si (KR); Sung-Hun Lee, Yongin-si (KR); Sang-Yeol Kim, Yongin-si (KR); Mu-Gyeom Kim, Yongin-si (KR)

(73) Assignees: Samsung Electronics Co., Ltd., Yeongtong-gu, Suwon-si, Gyeonggi-do (KR); Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 865 days.

(21) Appl. No.: 12/213,356

(22) Filed: Jun. 18, 2008

(65) Prior Publication Data
US 2009/0226757 A1    Sep. 10, 2009

(30) Foreign Application Priority Data
Mar. 4, 2008   (KR) .................. 10-2008-0020083

(51) Int. Cl.
*H01L 51/54* (2006.01)
(52) U.S. Cl. ......... 428/690; 428/917; 313/504; 313/506
(58) Field of Classification Search .................. None
See application file for complete search history.

(56) References Cited

U.S. PATENT DOCUMENTS

| | | | | |
|---|---|---|---|---|
| 6,831,406 B1 * | 12/2004 | Fukuyama et al. | ........... | 313/504 |
| 2003/0068528 A1 * | 4/2003 | Thompson et al. | ........... | 428/690 |
| 2006/0227079 A1 * | 10/2006 | Kashiwabara | .................. | 345/76 |
| 2006/0231843 A1 * | 10/2006 | Qin et al. | ......................... | 257/79 |
| 2006/0279203 A1 * | 12/2006 | Forrest et al. | ................. | 313/504 |
| 2008/0258606 A1 * | 10/2008 | Butler et al. | ................... | 313/504 |
| 2008/0284318 A1 * | 11/2008 | Deaton et al. | ................. | 313/504 |

FOREIGN PATENT DOCUMENTS
EP        1786242       *  5/2007
* cited by examiner

*Primary Examiner* — Dawn L. Garrett
(74) *Attorney, Agent, or Firm* — Robert E. Bushnell, Esq.

(57) ABSTRACT

A white Organic Light Emitting Device (OLED) includes: an anode and cathode spaced apart from each other; first, second, and third light emitting layers sequentially stacked between the anode and the cathode; and an electron injection induction layer, arranged between the second light emitting layer and the third light emitting layer, to induce the electron to flow into the second light emitting layer from the third light emitting layer. A difference between a Lowest Occupied Molecular Orbital (LUMO) energy level of the electron injection induction layer and the LUMO energy level of a dopant existing in the second light emitting layer is 0.4 eV or below.

21 Claims, 4 Drawing Sheets under 35 U.S.C. §119
WHITE ORGANIC LIGHT EMITTING DEVICE (OLED)

CLAIM OF PRIORITY

This application makes reference to, incorporates the same herein, and claims all benefits accruing under 35 U.S.C. §119 from an application for WHITE ORGANIC LIGHT EMITTING DEVICE earlier filed in the Korean Intellectual Property Office on the 4 of Mar. 2008 and there duly assigned Serial No. 2008-0020083.

BACKGROUND OF THE INVENTION

1. Field of the Invention

The present invention relates to an Organic Light Emitting Device (OLED), and more particularly, the present invention relates to a white OLED having stabilized colors and improved light emitting efficiency.

2. Description of the Related Art

Organic Light Emitting Devices (OLEDs) are light emitting devices that use a phenomenon whereby light is generated by combining an electron and a hole in an organic light emitting layer when a current or voltage is supplied in the organic light emitting layer. In order to obtain a better light emitting property, an OLED may have a multi-layer structure in which a Hole Injection Layer (HIL) and a Hole Transporting Layer (HTL) are formed between an anode electrode and the organic light emitting layer and an Electron Injection Layer (EIL) and an Electron Transporting Layer (ETL) are formed between a cathode electrode and the organic light emitting layer.

The driving voltage of the OLED is approximately 5 V so that low voltage driving of the OLED is possible. Also, surface emitting with high brightness, quick response speed, and a thinner OLED are realizable. In addition to this, color reproduction is excellent, wide viewing angles are available, and emitted colors can be easily changed by appropriate selection of fluorescent materials. Accordingly, OLEDs can be used in various fields, such as full color display devices, backlight units for Liquid Crystal Displays (LCDs), information display devices, vehicle display devices, and lighting devices.

The white OLED emits white light and has a structure in which light emitting layers of predetermined colors are stacked therein. Such a white OLED can be applied to, in particular, a paper-thin light source, a backlight unit for an LCD, and full color display devices employing a color filter. However, since the materials forming the light emitting layers of each color are different in the white OLED, if a current injected into the white OLED is changed, stable colors cannot be realized. In addition, light is generated from the light emitting layers of each color in the white OLED so that the light emitting efficiency of the white LCD is lower than that of the OLED including a light emitting layer of a single color.

SUMMARY OF THE INVENTION

The present invention provides a white Organic Light Emitting Device (OLED) having stabilized colors and improved light emitting efficiency.

According to an aspect of the present invention, a white Organic Light Emitting Device (OLED) is provided including: an anode and cathode spaced apart from each other; first, second, and third light emitting layers that are sequentially stacked between the anode and the cathode; and an electron injection induction layer, arranged between the second light emitting layer and the third light emitting layer, to induce electrons to flow into the second light emitting layer from the third light emitting layer. A difference between a Lowest Occupied Molecular Orbital (LUMO) energy level of the electron injection induction layer and the LUMO energy level of a dopant in the second light emitting layer is 0.4 eV or below.

The electron injection induction layer may be formed of a material having an excellent hole transporting property and electron transporting property. The electron injection induction layer may be formed of a carbazole, the carbazole compound including 4,4-N,N'-dicarbazole-biphenyl (CBP), a CBP derivative, N,N'-dicarbazolyl3,5-benzene (mCP), or a mCP derivative. The electron injection induction layer may be formed to have a thickness of 1-10 nm.

The first, second, and third light emitting layers may be, respectively, red, green, and blue light emitting layers. The first and second light emitting layers may include a host material having a better hole transporting property than an electron transporting property. The first light emitting layer may include a host material formed of a triphenylamine derivative, the triphenylamine derivative including N,N'-diphenyl-N,N'-bis(3-methylphenyl)-1,1'-bi-phenyl-4,4'-diamine (TPD) or N,N'-di(naphthalen-1-yl)-N,N'-diphenyl-benzidine (NPB). The second light emitting layer may include a host material formed of a triphenylamine derivative or a carbazole compound.

The third light emitting layer may include a fluorescent host material having an excellent hole transporting property and electron transporting property or a phosphorescent host material having a better electron transporting property than a hole transporting property. The first, second, and third light emitting layers may be, respectively, formed to have a thickness of 1-20 nm.

The white OLED may further include: a hole transporting layer (HTL) between the anode and the first light emitting layer; and an electron transporting layer (ETL) between the cathode and the third light emitting layer. The HTL may be formed of N,N'-diphenyl-N,N'-bis(3-methylphenyl)-1,1'-bi-phenyl-4,4'-diamine (TPD) or N,N'-di(naphthalen-1-yl)-N,N'-diphenyl-benzidine (NPB). The ETL may be formed of an aryl compound, the aryl compound may include: oxadiazole, triazole, phenanthroline, benzoxazole, or benzthiazole.

The white OLED may further include a Hole Injecting Layer (HIL) between the anode and the HTL and an Electron Injecting Layer (EIL) between the cathode and the ETL. The HIL may be formed of 4,4',4''-tris(3-methylphenylphenylamino)triphenylamine (MTDATA), copper phthalocyanine (CuPc), or poly(3,4-ethylenedioxythiophene, polystyrene sulfonated (PEDOT/PSS). The EIL may be formed of Lithium Fluoride (LiF) or Lithium Quinolate (LiQ).

The anode may be formed of a material having a work function of 4.7 eV or above. For example, the anode may be formed of Indium Tin Oxide (ITO), Indium Zinc Oxide (IZO), $SnO_2$, or ZnO and the cathode may be formed of at least one metal selected from the group consisting of aluminum (Al), silver (Ag), magnesium (Mg), Lithium (Li), or Calcium (Ca).

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Figure 1:
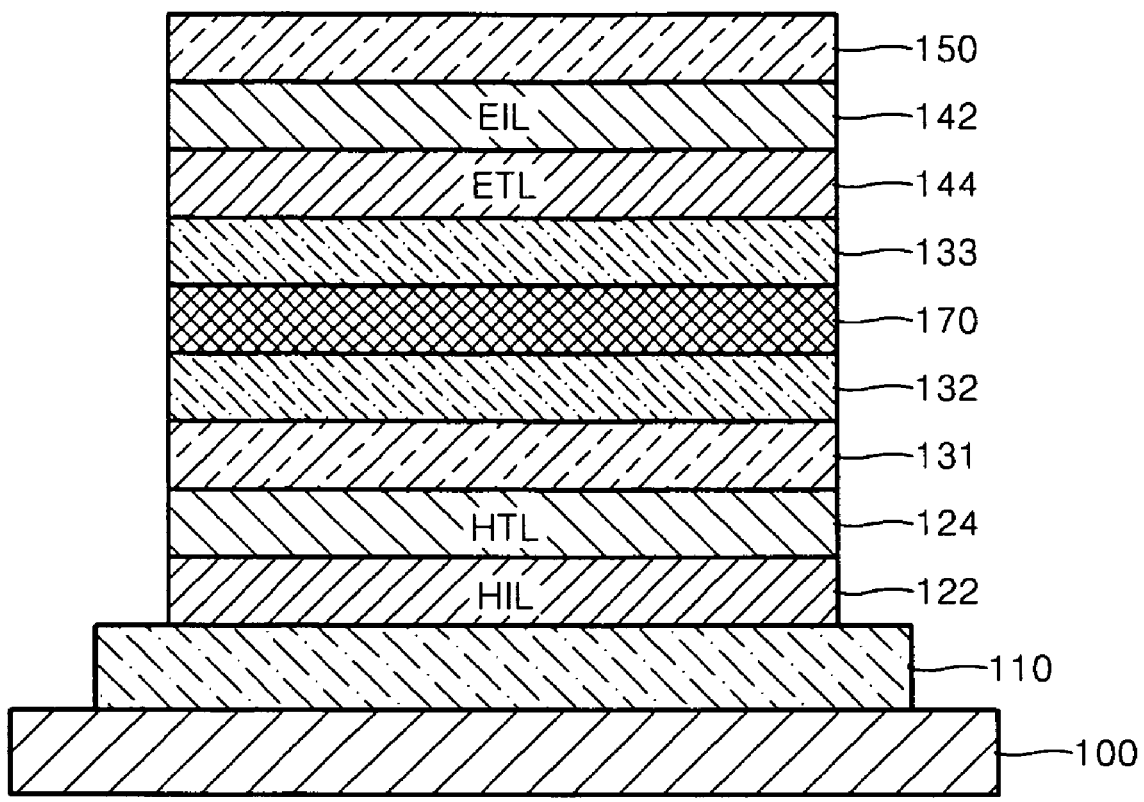
FIG. 1 is a cross-sectional view of a white Organic Light Emitting Device (OLED) according to an embodiment of the present invention.

The present invention is described more fully hereinafter with reference to the accompanying drawings, in which exemplary embodiments of the present invention are shown. This should not be construed as limiting the claims to the exemplary embodiments shown. Rather, these embodiments are provided to convey the scope of the present invention to those of ordinary skill in the art. In the drawings, the size and relative sizes of elements and regions may be exaggerated for clarity.

It will be understood that when an element or layer is referred to as being "on", "disposed on", "disposed", or "between" another element or layer, it can be directly on, disposed on, disposed, or between the other element or layer, or intervening elements or layers can be present.

The terms "first," "second," and the like, "primary," "secondary," and the like, as used herein do not denote any order, quantity, or importance, but rather are used to distinguish one element, region, component, layer, or section from another. The terms "front", "back", "bottom", and/or "top" are used herein, unless otherwise noted, merely for convenience of description, and are not limited to any one position or spatial orientation.

The terms "a" and "an" do not denote a limitation of quantity, but rather denote the presence of at least one of the referenced item. The suffix "(s)" as used herein is intended to include both the singular and the plural of the term that it modifies, thereby comprising one or more of that term (e.g., the layer(s) includes one or more layers).

Reference throughout the specification to "one embodiment", "another embodiment", "an embodiment", and so forth, means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various exemplary embodiments.

The endpoints of all ranges directed to the same component or property are inclusive of the endpoint and independently combinable, e.g., ranges of "up to about 25 wt. %, or, more specifically, about 5 wt. % to about 20 wt. %," is inclusive of the endpoints and all intermediate values of the ranges of "about 5 wt. % to about 25 wt. %," etc. The modifier "about" used in connection with a quantity is inclusive of the stated value and has the meaning dictated by the context (e.g., includes the degree of error associated with measurement of the particular quantity).

Unless defined otherwise, technical and scientific terms used herein have the same meaning as is commonly understood by one of ordinary skill in the art to which this invention pertains.

Figure 2:
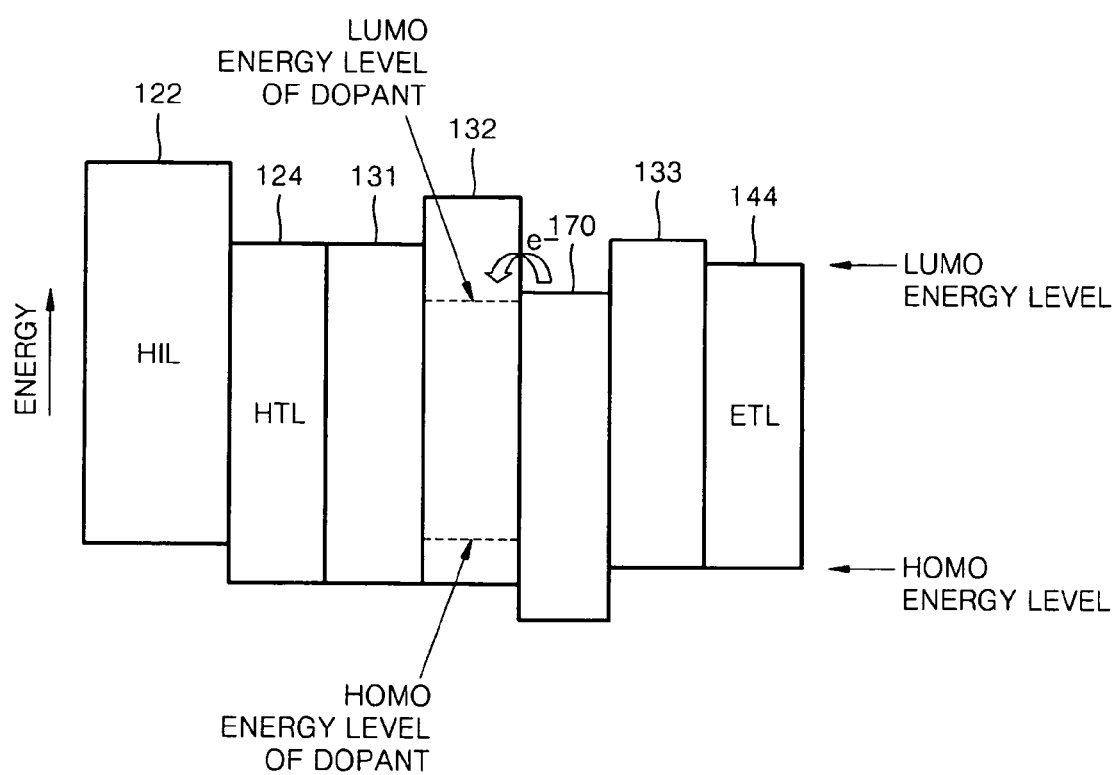
FIG. 2 is a representation of energy levels of each material layer forming the white OLED of FIG. 1.

FIG. 1 is a cross-sectional view of a white Organic Light Emitting Device (OLED) according to an embodiment of the present invention and FIG. 2 is a representation of energy levels of each material layer forming the white OLED of FIG. 1.

Referring to FIGS. 1 and 2, the white OLED according to the current embodiment of the present invention includes an anode 110 and a cathode 150 that are spaced apart from each other, first, second, and third light emitting layers 131, 132, 133 that are sequentially stacked between the anode 110 and the cathode 150, and an electron injection induction layer 170 disposed between the second light emitting layer 132 and the third light emitting layer 133.

The anode 110 may be formed on a substrate 100. The substrate 100 may be formed of a transparent glass, quartz, or plastic. The anode 110 may be formed by depositing transparent conductive materials on the substrate 100 and by patterning the transparent conductive materials. The anode 110 is formed of a material having a high conductivity and work function. More specifically, the anode 110 is formed of a material having a work function of about 4.7 eV or above so as to smoothly inject holes. The anode 110 may be formed of, for example, Indium Tin Oxide (ITO), Indium Zinc Oxide (IZO), $SnO_2$, or ZnO. The cathode 150 is formed of a material having a low work function. The cathode 150 may be formed of, for example, a metal, such as aluminum (Al), silver (Ag), magnesium (Mg), Lithium (Li), or Calcium (Ca) or an alloy thereof. However, the materials for forming the cathode 150 are not limited thereto.

The first, second, and third light emitting layers 131, 132, and 133 are sequentially formed between the anode 110 and the cathode 150. The first light emitting layer 131 may be, for example, a red light emitting layer. Such a first light emitting layer 131 may be formed by using, for example, a red dopant in a predetermined host material. The first light emitting layer 131 may be formed of a material which can smoothly transport holes toward the third light emitting layer 133. Accordingly, the first light emitting layer 131 includes a host material having a better hole transporting property than an electron transporting property. The host material used for the first light emitting layer 131 may be, for example, a triphenylamine derivative such as N,N'-diphenyl-N,N'-bis(3-methylphenyl)-1,1'-bi-phenyl-4,4'-diamine (TPD) or N,N'-di(naphthalen-1-yl)-N,N'-diphenyl-benzidine (NPB). However, the present invention is not limited thereto. The first light emitting layer 131 is formed to have a thickness of about 1-20 nm, for example.

The second light emitting layer 132 may be, for example, a green light emitting layer. Such a second light emitting layer 132 may be formed by using, for example, a green dopant in a predetermined host material. As in the first light emitting layer 131, the second light emitting layer 132 is formed of a material which can smoothly transport holes toward the third light emitting layer 133. Accordingly, the second light emitting layer 132 includes a host material having a better hole transporting property than an electron transporting property. The host material used for the second light emitting layer 132 may be a triphenylamine derivative (for example, N,N'-diphenyl-N,N'-bis(3-methylphenyl)-1,1'-bi-phenyl-4,4'-diamine (TPD) or N,N'-di(naphthalen-1-yl)-N,N'-diphenyl-benzidine (NPB)) or a carbazole compound (for example, 4,4-N,N'-dicarbazole-biphenyl (CBP), a CBP derivative, N,N'-dicarbazolyl-3,5-benzene (mCP), or a mCP derivative). However, the host material is not limited thereto. The second light emitting layer 132 is formed to have a thickness of about 1-20 nm, for example.

The third light emitting layer 133 may be, for example, a blue light emitting layer. Such a third light emitting layer 133 may be formed by using, for example, a blue dopant in a predetermined host material. The third light emitting layer 133 uses some of the electrons injected from the cathode 150 during light emitting and transports remaining electrons toward the first and second light emitting layers 131 and 132. Accordingly, the third light emitting layer 133 may include a fluorescent host material having an excellent hole transporting property and electron transporting property or a phosphorescent host material having a better electron transporting property than a hole transporting property. The host material used for the third light emitting layer 133 may be, for example, an anthracene derivative, a pyrene derivative, a perylene derivative, Alq3, a carbazole compound (for example, 4,4-N,N'-dicarbazole-biphenyl (CBP), a CBP derivative, N,N'-dicarbazolyl-3,5-benzene (mCP), or a mCP derivative), phenyloxazole (ZnPBO), or phenylthiazole (ZnPBT). However, the host material is not limited thereto. The third light emitting layer 133 is formed to have a thickness of about 1-20 nm, for example.

The electron injection induction layer 170 is disposed between the second light emitting layer 132 and the third light emitting layer 133. The electron injection induction layer 170 induces electrons to flow into the second light emitting layer 132 from the third light emitting layer 133, thereby controlling the intensity of light from the first and second light emitting layers 131 and 132. More specifically, the electron injection induction layer 170 not only transports the holes toward the third light emitting layer 133 from the first and second light emitting layers 131 and 132 but also injects electrons into a Lowest Occupied Molecular Orbital (LUMO) energy level of the dopant existing in the second light emitting layer 132, thereby transporting the electrons injected from the third light emitting layer 133 to the second light emitting layer 132. Accordingly, as illustrated in FIG. 2, the electron injection induction layer 170 may be formed of a material with the LUMO energy level that is similar to that of the dopant existing in the second light emitting layer 132. More specifically, the difference between the LUMO energy level of the electron injection induction layer 170 and the LUMO energy level of the dopant existing in the second light emitting layer 132 may be about 0.4 eV or below. Such an electron injection induction layer 170 may have an excellent hole transporting property and electron transporting property. The electron injection induction layer 170 may be formed of, for example, a carbazole compound such as 4,4-N,N'-dicarbazole-biphenyl (CBP), a CBP derivative, N,N'-dicarbazolyl-3,5-benzene (mCP), or a mCP derivative. However, the material for forming the electron injection induction layer 170 is not limited thereto. The electron injection induction layer 170 is formed to have a thickness of about 1-10 nm, for example.

A Hole Transporting Layer (HTL) 124 may be disposed between the anode 110 and the first light emitting layer 131 for easily transporting the hole toward the first light emitting layer 131. The HTL 124 may be formed of, for example, a triphenylamine derivative having high hole mobility and excellent stability such as N,N'-diphenyl-N,N'-bis(3-methylphenyl)-1,1'-bi-phenyl-4,4'-diamine (TPD) or N,N'-di(naphthalen-1-yl)-N,N'-diphenyl-benzidine (NPB). However, the material for forming the HTL 124 is not limited thereto. The HTL 124 is formed to have a thickness of about 10 nm or above, for example. In addition, a Hole Injection Layer (HIL) 122 may be further disposed between the anode 110 and the HTL 124 for easily injecting the hole. The HIL 122 may be formed of, for example, a triphenylamine derivative including 4,4',4"-tris(3-methylphenylphenylamino) triphenylamine (MTDATA), copper phthalocyanine (CuPc), or poly(3,4-ethylenedioxythiophene, polystyrene sulfonated (PEDOT/PSS). However, the materials for forming the HIL 122 are not limited thereto.

An Electron Transporting Layer (ETL) 144 may be further disposed between the cathode 150 and the third light emitting layer 133 for easily transporting the electron toward the third light emitting layer 133. The ETL 144 may be formed of, for example, an aryl compound such as oxadiazole, triazole, phenanthroline, benzoxazole, or benzthiazole. However, the material for forming the ETL 144 is not limited thereto. In addition, an Electron Injection Layer (EIL) 142 may be further disposed between the cathode 150 and the ETL 144 for easily injecting the electrons. The EIL 142 may be formed of, for example, Lithium Fluoride (LIF) or Lithium Quinolate (LiQ). However, the material for forming the EIL 142 is not limited thereto.

In the white organic light emitting device according to the current embodiment of the present invention, as described above, the electron injection induction layer 170 is disposed between the second light emitting layer 132 and the third light emitting layer 133, thereby controlling the intensity of light from the first and second light emitting layers 131 and 132.

Figure 3:
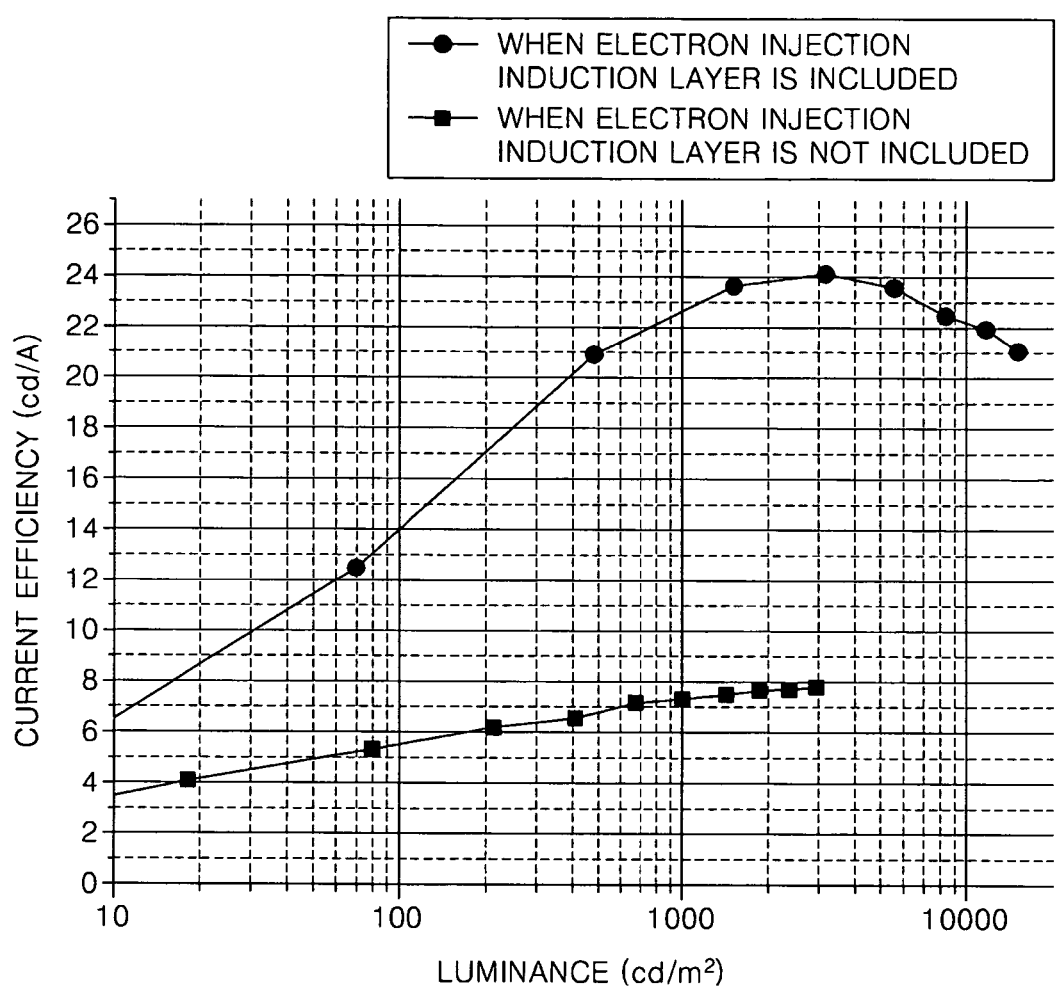
FIG. 3 is a graph of the current efficiency according to a brightness of a white OLED by comparing cases when an electron injection induction layer is included and when an electron injection induction layer is not included in the white OLED.

FIG. 3 is a graph of current efficiency according to a brightness of the white OLED by comparing cases when an electron injection induction layer 170 is included and when an electron injection induction layer is not included in the white OLED. Referring to FIG. 3, current efficiency is greatly improved in the white OLED including the electron injection induction layer 170, compared with that of the white OLED without the electron injection induction layer 170.

Figure 4:
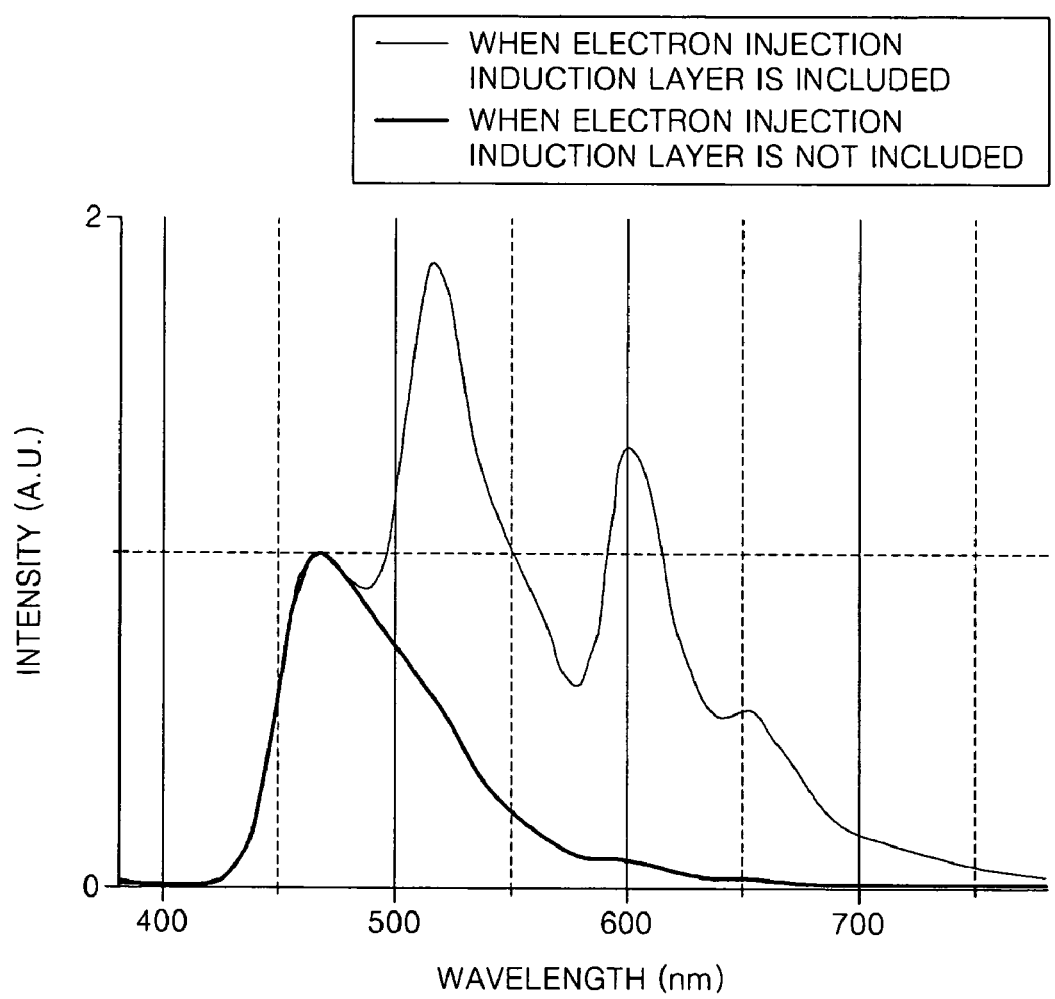
FIG. 4 is a graph of a light emitting spectrum of a white OLED by comparing cases when an electron injection induction layer is included and when an electron injection induction layer is not included in the white OLED.

FIG. 4 is a graph of a light emitting spectrum of the white OLED by comparing cases when an electron injection induction layer 170 is included and when an electron injection induction layer is not included in the white OLED. Referring to FIG. 4, only blue light is observed in the white OLED without the electron injection induction layer 170, whereas blue, red, and green lights are observed in the white OLED including the electron injection induction layer 170.

As described above, a white Organic Light Emitting Device (OLED) includes an electron injection induction layer between second and third light emitting layers to induce electrons to flow toward first and second light emitting layers so that light emitting efficiency is improved and stable colors are realized.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A white Organic Light Emitting Device (OLED) comprising:
    an anode and cathode spaced apart from each other;
    first, second, and third light emitting layers sequentially stacked between the anode and the cathode; and
    an electron injection induction layer, arranged between the second light emitting layer and the third light emitting layer, to induce electrons to flow into the second light emitting layer from the third light emitting layer;
    wherein a difference between a Lowest Occupied Molecular Orbital (LUMO) energy level of the electron injection induction layer and the LUMO energy level of a dopant in the second light emitting layer is 0.4 eV or below, the distance between the first light emitting layer and the anode is shorter than the distance between the third light emitting layer and the anode, and the first light emitting layer comprises a host material of a triphenylamine derivative.

2. The white OLED of claim 1, wherein the electron injection induction layer comprises a material having a hole transporting property and electron transporting property.

3. The white OLED of claim 1, wherein the electron injection induction layer comprises a carbazole compound.

4. The white OLED of claim 3, wherein the carbazole compound comprises 4,4-N,N'-dicarbazole-biphenyl (CBP), a CBP derivative, N,N'-dicarbazolyl-3,5-benzene (mCP), or a mCP derivative.

5. The white OLED of claim 1, wherein the electron injection induction layer has a thickness in a range of 1-10 nm.

6. The white OLED of claim 1, wherein the first, second, and third light emitting layers respectively comprise red, green, and blue light emitting layers.

7. The white OLED of claim 1, wherein the first and second light emitting layers comprise a host material having a better hole transporting property than an electron transporting property.

8. The white OLED of claim 1, wherein the triphenylamine derivative comprises N,N'-diphenyl-N,N'-bis(3-methylphenyl)-1,1'-bi-phenyl-4,4'-diamine (TPD) or N,N'-di(naphthalen-1-yl)-N,N'-diphenyl-benzidine (NPB).

9. The white OLED of claim 1, wherein the second light emitting layer comprises a host material of a triphenylamine derivative or a carbazole compound.

10. The white OLED of claim 1, wherein the third light emitting layer comprises a fluorescent host material having a hole transporting property and electron transporting property or a phosphorescent host material having a better electron transporting property than a hole transporting property.

11. The white OLED of claim 1, wherein the first, second, and third light emitting layers each have a thickness in a range of 1-20 nm.

12. The white OLED of claim 1, further comprising a Hole Transporting Layer (HTL) arranged between the anode and the first light emitting layer and an Electron Transporting Layer (ETL) arranged between the cathode and the third light emitting layer.

13. The white OLED of claim 12, wherein the HTL comprises N,N'-diphenyl-N,N'-bis(3-methylphenyl)-1,1'-bi-phenyl-4,4'-diamine (TPD) or N,N'-di(naphthalen-1-yl)-N,N'-diphenyl-benzidine (NPB).

14. The white OLED of claim 12, wherein the ETL comprises an aryl compound.

15. The white OLED of claim 14, wherein the aryl compound comprises oxadiazole, triazole, phenanthroline, benzoxazole, or benzthiazole.

16. The white OLED of claim 12, further comprising a Hole Injecting Layer (HIL) arranged between the anode and the HTL and an Electron Injecting Layer (EIL) arranged between the cathode and the ETL.

17. The white OLED of claim 16, wherein the HIL comprises 4,4',4"-tris (3-methylphenylphenylamino)triphenylamine (MTDATA), copper phthalocyanine (CuPc), or poly (3,4-ethylenedioxythiphene, polystyrene sulfonated (PEDOT/PSS).

18. The white OLED of claim 16, wherein the EIL comprises Lithium Fluoride (LIF) or Lithium Quinolate (LiQ).

19. The white OLED of claim 1, wherein the anode comprises a material having a work function of 4.7 eV or above.

20. The white OLED of claim 1, wherein the anode comprises Indium Tin Oxide (ITO), Indium Zinc Oxide (IZO), $SnO_2$, or ZnO.

21. The white OLED of claim 1, wherein the cathode comprises at least one metal selected from the group consisting of aluminum (Al), silver (Ag), magnesium (Mg), Lithium (Li), or Calcium (Ca).

* * * * *